United States Patent
Karim et al.

(10) Patent No.: US 8,405,181 B2
(45) Date of Patent: Mar. 26, 2013

(54) HIGH BRIGHTNESS AND HIGH CONTRAST PLASTIC LEADED CHIP CARRIER LED

(75) Inventors: Norfidathul Aizar Abdul Karim, Penang (MY); Chiau Jin Lee, Penang (MY); Keat Chuan Ng, Penang (MY)

(73) Assignee: Intellectual Discovery Co., Ltd., Seoul (KR)

( * ) Notice: Subject to any disclaimer, the term of this patent is extended or adjusted under 35 U.S.C. 154(b) by 197 days.

(21) Appl. No.: 13/049,643

(22) Filed: Mar. 16, 2011

(65) Prior Publication Data

US 2012/0235287 A1  Sep. 20, 2012

(51) Int. Cl.
*H01L 31/0203* (2006.01)
*H01L 29/22* (2006.01)

(52) U.S. Cl. .......... 257/433; 257/98; 257/100; 257/666; 257/787; 257/E25.032

(58) Field of Classification Search ............. 257/98, 257/433, 666, 100, E25.032
See application file for complete search history.

(56) References Cited

U.S. PATENT DOCUMENTS

| | | | | |
|---|---|---|---|---|
| 7,119,422 B2 * | 10/2006 | Chin | ............... | 257/666 |
| 7,592,631 B2 * | 9/2009 | Park et al. | ............... | 257/81 |
| 7,846,752 B2 * | 12/2010 | Kim et al. | ............... | 438/22 |
| 7,968,894 B2 * | 6/2011 | Park et al. | ............... | 257/81 |
| 2004/0041222 A1 * | 3/2004 | Loh | ............... | 257/433 |
| 2005/0199900 A1 * | 9/2005 | Lin et al. | ............... | 257/99 |
| 2005/0269587 A1 * | 12/2005 | Loh et al. | ............... | 257/99 |
| 2008/0283861 A1 * | 11/2008 | Loh et al. | ............... | 257/98 |
| 2009/0141516 A1 | 6/2009 | Wu et al. | | |
| 2011/0316022 A1 * | 12/2011 | Hussell | ............... | 257/98 |

FOREIGN PATENT DOCUMENTS

CN  2828989 Y  10/2006
CN  101022147 A  8/2007

OTHER PUBLICATIONS

SunLED, "Jet Black PLCC LED", available at http://sunledusa.com/NewProducts.asp?ID=12, SunLED Corporation, 2010, 1 page.
Avago Technologies, "PLCC-4 Black Body Surface Mount LED Indicator", Available at http://www.avagotech.com/pages/en/leds/surface_mount_plcc_leds/plcc-4_leds_multi_color_series/asmt-qtc0-0aa02/, Avago Technologies, 2005-2011, 2 pages.

* cited by examiner

*Primary Examiner* — Nitin Parekh
(74) *Attorney, Agent, or Firm* — Fox Rothschild LLP

(57) ABSTRACT

A Plastic Leaded Chip Carrier (PLCC) package is disclosed. The PLCC package provides a light source that is both high contrast and high brightness. Specifically, the PLCC package includes a reflector cup whose surface area is partially inclusive of a lead frame and partially inclusive of a plastic housing that surrounds the lead frame.

20 Claims, 9 Drawing Sheets

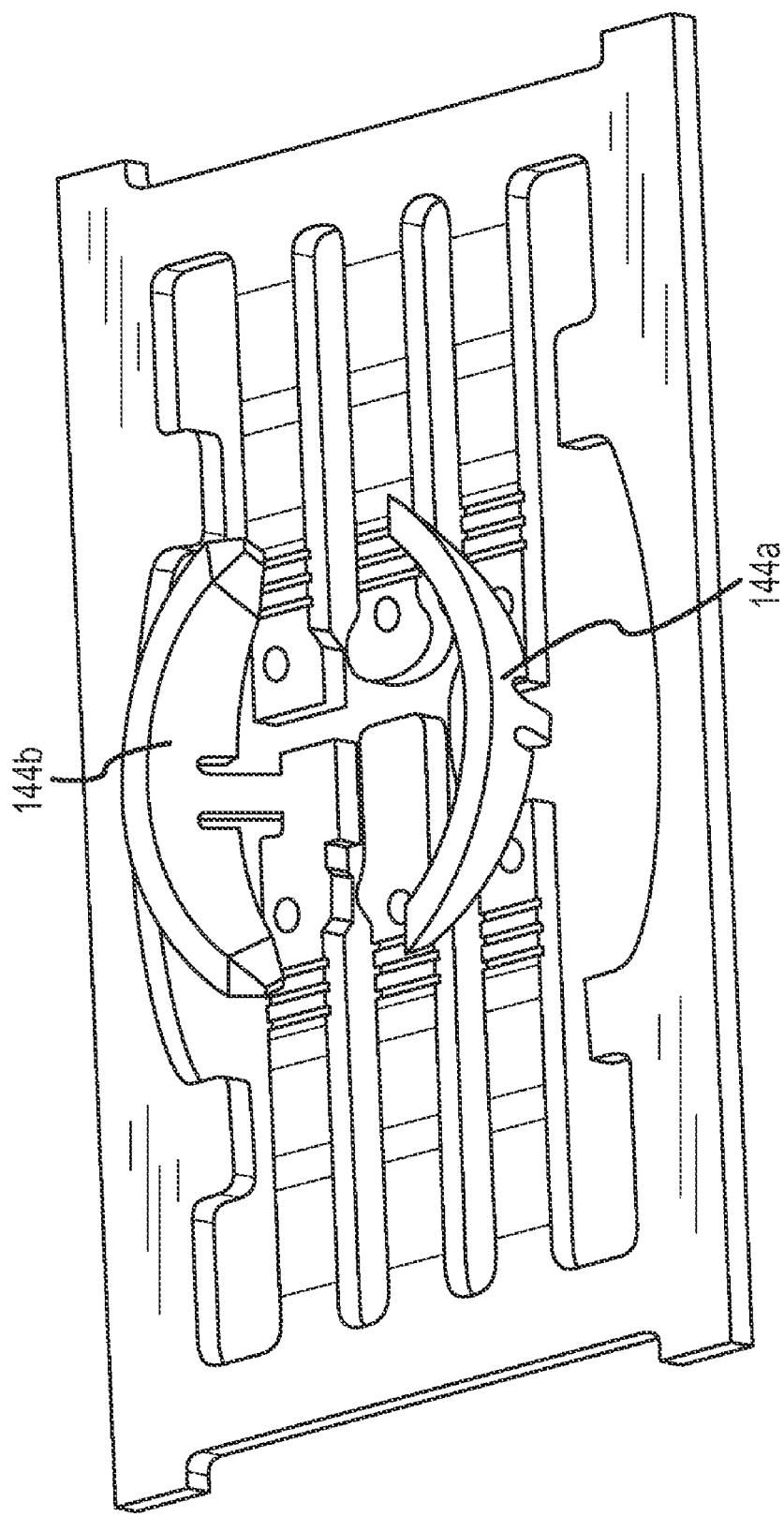

HIGH BRIGHTNESS AND HIGH CONTRAST PLASTIC LEADED CHIP CARRIER LED

FIELD OF THE DISCLOSURE

The present disclosure is generally directed toward light emitting devices and packages for the same.

BACKGROUND

Light Emitting Diodes (LEDs) have many advantages over conventional light sources, such as incandescent, halogen and fluorescent lamps. These advantages include longer operating life, lower power consumption, and smaller size. Consequently, conventional light sources are increasingly being replaced with LEDs in traditional lighting applications. As an example, LEDs are currently being used in flashlights, camera flashes, traffic signal lights, automotive taillights and display devices.

Two prevalent types of LED form factors are surface-mount LEDs and thru-hole LEDs. Surface-mount LEDs are desirable for applications which require a low LED profile. Among the various packages for surface-mount LEDs, an LED package of interest is the Plastic Leaded Chip Carrier (PLCC) package. Surface mount LEDs in PLCC packages may be used, for example, in automotive interior display devices, electronic signs and signals, and electrical equipment.

While the PLCC package does offer a relative low profile as compared to its thru-hole counterpart, currently available PLCC packages cannot simultaneously provide high contrast and high brightness. Specifically, a PLCC package that is designed to provide high contrast (e.g., by using a black plastic as its housing) does not generally provide high brightness because the plastic used for the housing absorbs light rather than reflects light. Conversely, a PLCC package that is designed to provide high brightness (e.g., by using a white plastic as its housing) does not generally provide high contrast.

It should also be noted that a thru-hole LED is almost always brighter than a PLCC package, regardless of whether a black or white plastic is used for the housing. This is because the thru-hole LED typically has a metal-plated reflector cup whereas the reflector cup in a PLCC package is traditionally plastic, which is not as reflective as the metal use in thru-hole LEDs.

To date, there is no known LED package that combines the low profile nature of a PLCC package as well as simultaneously achieves high contrast and brightness.

BRIEF DESCRIPTION OF THE DRAWINGS

The present disclosure is described in conjunction with the appended figures:

FIG. 5D depicts a fourth stage of a lead frame manufacturing process in accordance with embodiments of the present disclosure.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Furthermore, although the depicted PLCC package 100 is a conventional C-bend PLCC, embodiments of the present disclosure are not so limited. In particular, embodiments of the present disclosure can be utilized in any type of known PLCC package and/or platform. Specifically, any type of PLCC package and/or platform or similar type of package for a light emitting device that uses a plastic molded lead frame can incorporate one or more features disclosed herein. Suitable types of PLCC packages that may incorporate embodiments of the present disclosure include, without limitation, a Moonstone Package which has one or more leads protruding to its side, an L-bend PLCC, a PLCC with one or more leads protruding from its bottom, and so on. In some embodiments, the PLCC package may be manufactured according to the industry standard PLCC-4.

Figure 1:
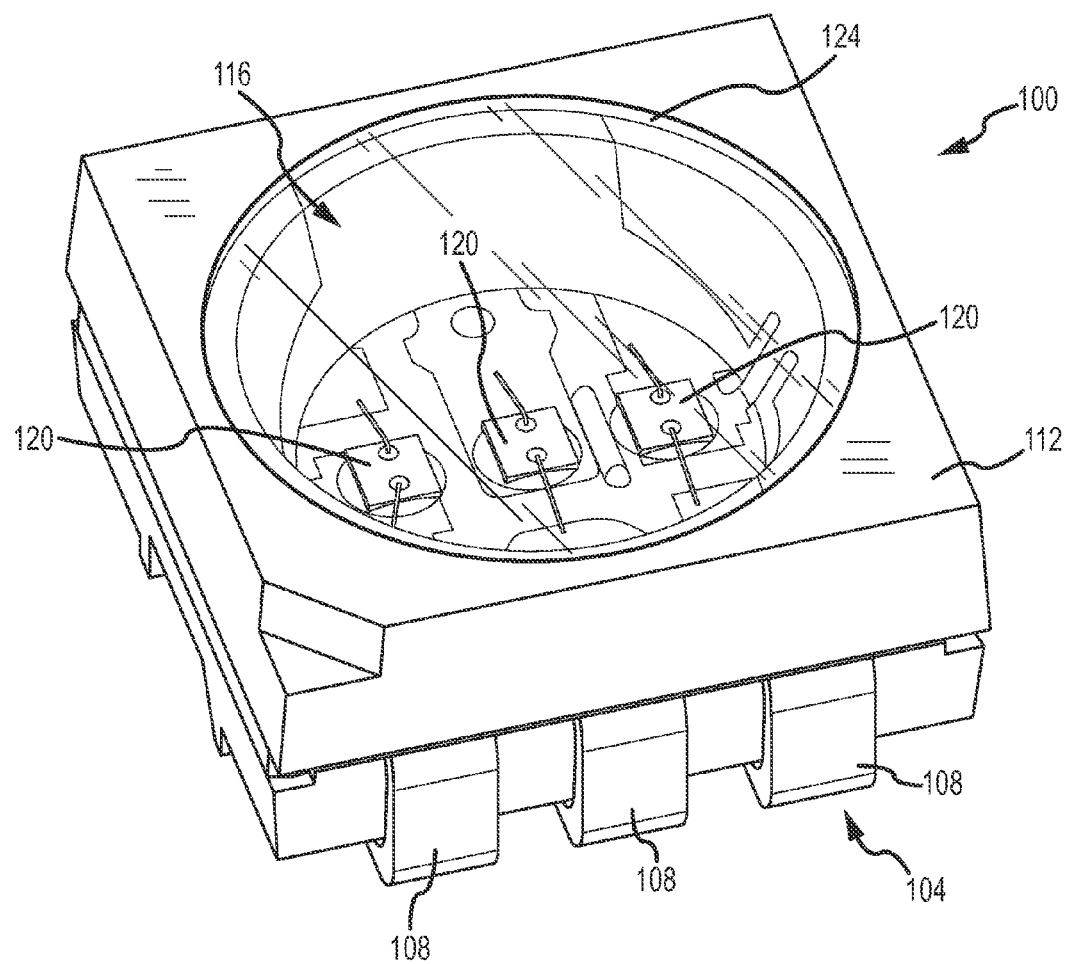
FIG. 1 is a perspective view of a PLCC package in accordance with embodiments of the prior art.

With reference now to FIGS. 1-4, a PLCC package 100 will be described in accordance with at least some embodiments of the present disclosure. Referring initially to FIG. 1, a completed PLCC package 100 is depicted in accordance with at least some embodiments of the present disclosure. The PLCC package 100 may comprise a lead frame 104 and a housing 112 that surrounds the lead frame 104. The lead frame 104 may comprise a plurality of leads 108. The leads 108 may be provided to supply electrical current to light sources 120 mounted thereto. In some embodiments, the lead frame 104 and housing 112 may comprise a reflector cup 116 which is a depression in the housing 112 that is configured to house the one or more light sources 120 and in some embodiments the reflector cup 116 may be partially or completely filled with an encapsulant 124.

In some embodiments, the housing 112 is made of a plastic material, such as Polyphthalamide (PPA). Of course, the housing 112 may be made of other types of materials such as any other type of polymer or combination of polymers. In some embodiments, the housing 112 may be constructed of any polymer or combination of polymers using extrusion, machining, micro-machining, molding, injection molding, or a combination of such manufacturing techniques.

In the embodiment depicted in FIG. 1, the leads 108 of the lead frame 104 are exposed in the bottom of the reflector cup 116. The leads 108 may then extend or pass through part of the housing 112 to an outer surface (e.g., side surface(s) and/or bottom surface) of the housing 112, thereby facilitating attachment of the PLCC package 100 to an electrical circuit (e.g., bonding pads on a Printed Circuit Board (PCB)). Although the leads 108 of the lead frame 104 extending to the outer surface of the housing 112 are depicted a C-leads, embodiments of the present disclosure are not so limited. In particular, any other type or shape of leads may be utilized such as, for example, SOJ leads, gull wing leads, reverse gull wing leads, and straight cut leads.

The reflector cup 116 may be formed as a depression in a top portion of the housing 112. In some embodiments, the interior cylindrical (or conical) surface of the reflector cup 116 partially comprises the material of the housing 112 (e.g., plastic) and partially comprises the material of the lead frame 104 (e.g., metal). In some embodiments, any path traveled around the circumference of the interior cylindrical (or conical) surface of the reflector cup 116 crosses both the lead frame 104 and the housing 112. Accordingly, the interior cylindrical (or conical) surface of the reflector cup 116 is configured to increase the brightness of the PLCC package 100 (e.g., by virtue of the fact that the interior cylindrical (or conical) surface of the reflector cup 116 comprises the highly reflective metal of the lead frame 104).

The material selected for the housing 112 may also be selected to increase the contrast of the PLCC package 100. In particular, the housing 112 may comprise a black or dark colored plastic that increases the contrast of the PLCC package 100. Because the housing 112 may include a black plastic and the reflector cup 116 at least partially includes the metal of the lead frame 104, the PLCC package 100 simultaneously provides both good contrast and brightness properties.

The light source(s) 120, in some embodiments, comprises a single LED, a plurality of LEDs, or an array of LEDs. The embodiment depicted in FIG. 1 shows a PLCC package 100 that comprises three light sources 120. Each light source 120 is connected to a different lead 108; accordingly, the lead frame 104 may comprise three leads 108 when there are three light sources 120. As can be appreciated, a greater or lesser number of light sources 120 may be included in the PLCC package 100 without departing from the scope of the present disclosure. Where two or more light sources 120 are provided in the reflector cup 116, the light sources 120 may have the same or different light-generating properties. As one example, a first light source 120 may generate light at a first wavelength and a second light source 120 may generate light at a second wavelength. Where three light sources 120 are provided, one light source 120 may be configured to emit red light, another light source 120 may be configured to emit green light, and another light source 120 may be configured to emit blue light. Other variations of light source properties can also be accommodated without departing from the scope of the present disclosure.

Any number of materials may be suitable for use as the encapsulant 124. Examples of such materials include, without limitation, epoxy, silicone, a hybrid of silicone and epoxy, phosphor, a hybrid of phosphor and silicone, an amorphous polyamide resin or fluorocarbon, glass, plastic, or combinations thereof. In some embodiments, the encapsulant 124 completely fills the reflector cup 116. The encapsulant 124 may either be formed to have a lens shape that extends beyond the top surface of the housing 112 or the reflector cup 116 may be flush filled with the encapsulant 124.

Figure 2:
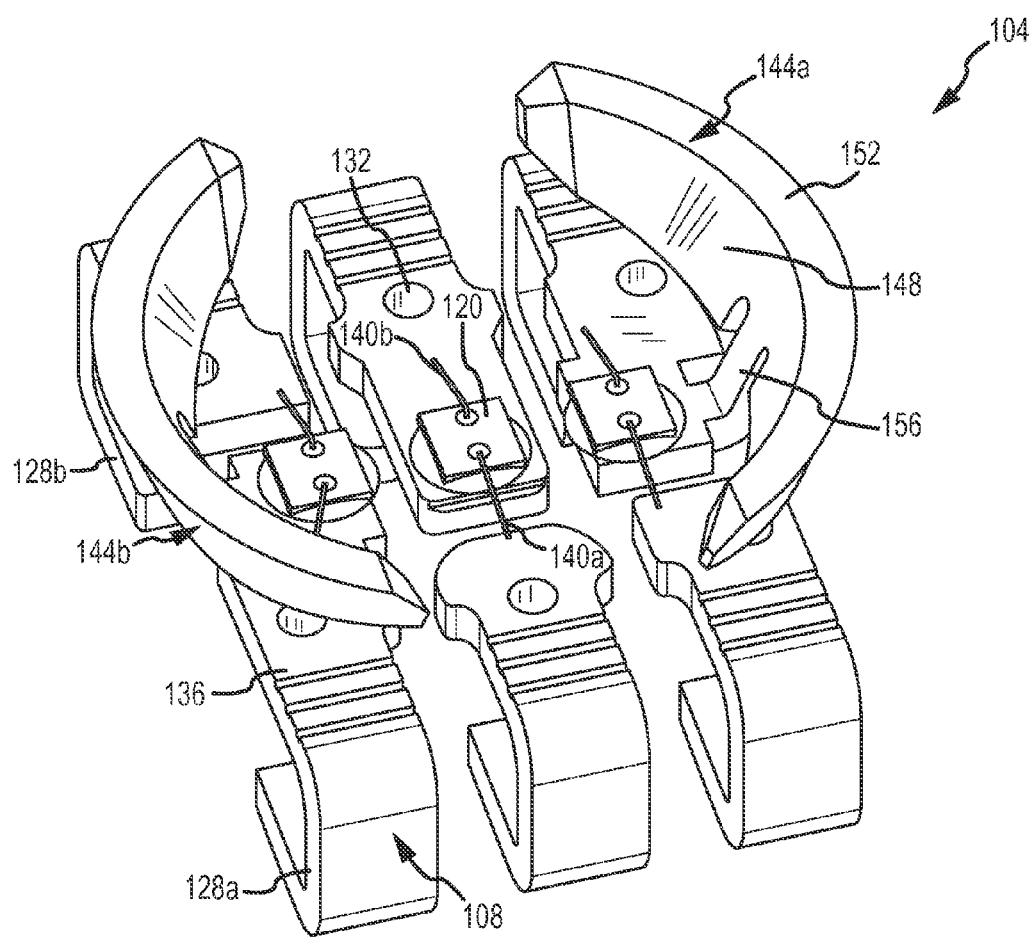
FIG. 2 is a perspective view of a lead frame for a PLCC package in accordance with embodiments of the present disclosure.

With reference now to FIG. 2, additional details of the lead frame 104 will be described in accordance with at least some embodiments of the present disclosure. As noted above, the lead frame 104 may be configured to carry current to the light source(s) 120 as well as reflect light emitted by the light source(s) 120. By incorporating the lead frame 104 into the interior walls of the reflector cup 116, the reflectivity of the reflector cup 116 can be enhanced without requiring an additional step of applying a reflective material to the interior surface of the reflector cup 116. This is advantageous because additional manufacturing steps increase product cost and extend the amount of time required for manufacturing.

As discussed above, the lead frame 104 may comprise a plurality of leads 108 and each lead 108 may be configured to carry electrical current to a light source 120. Each lead 108 may comprise a first portion 128a and a second portion 128b that is physically separated from the first portion 128a. Surfaces of both the first and second portions 128a, 128b may be exposed in the bottom of the reflector cup 116.

Where an LED or similar light source is used, one or more bonding wires 140a, 140b may be used to connect each light source 120 to the different portions of the leads 108. One surface of the light source 120 may correspond to an anode of the light source 120 and another surface of the light source 120 may correspond to a cathode of the light source 120. Alternatively, as displayed in FIG. 2, both the anode and cathode may be on the same surface of the light source 120.

By connecting the light source 120 to two different portions 128a, 128b of a lead 108, an electrical potential can be applied to the anode and cathode of the light source 120 thereby energizing the light source 120 and causing it to emit light. A light source 120 comprising both an anode and cathode on a common surface may be constructed using known flip-chip manufacturing processes or any other known method for establishing both an anode and cathode on a common side of a light source 120. In such an embodiment, multiple bonding wires 140a, 140b may be used to connect to the anode and cathode separately to the first portion 128a of the lead 108 and the second portion 128b of the lead 108. Alternatively, where the cathode and anode are on opposite surfaces of the light source 120, it may be possible to utilize only one bonding wire (to bridge the gap between portions 128a, 128b) as the bottom surface of the light source 120 may be physically and electrically connected to the lead 108.

In some embodiments, the light source(s) 120 is configured to emit light from its top surface. Light emitted by the light source(s) 120 may be coherent or incoherent in nature. In some embodiments, incoherent light is emitted by the light source(s) 120 and is scattered within the reflector cup 116. The emitted light may reflect off the interior walls of the reflector cup 116 that rise above the light source(s) 120.

As noted above, the interior walls of the reflector cup 116 may comprise both the lead frame 104 and the housing 112. As can be seen in FIG. 2, the lead frame 104 may be configured with one or more raised portions that are integrated into the interior walls of the reflector cup 116. The embodiment of FIG. 2 includes a first lead frame portion of reflector cup 144a and a second lead frame portion of reflector cup 144b. The first lead frame portion of the reflector cup 144a may be integrally connected to one of the leads 108 via a connector 156. Likewise, the second lead frame portion of the reflector cup 144b may be integrally connected to another one of the leads 108 via another connector 156.

It should be appreciated that more than one raised portion may be connected to a single lead 108. Accordingly, the number of raised portions of the lead frame 104 that are integrated into the interior walls of the reflector cup 116 are not necessarily limited by the number of leads 108 in the lead frame 104. Moreover, one, two, three, four, or more different portions of the lead frame 104 may be raised above the light source(s) 120 and integrated into the interior walls of the reflector cup 116. In some embodiments, the raised lead frame portions of the reflector cup 144a, 144b are physically separated from one another to preclude electrical shorts between the leads 108.

In some embodiments, each raised lead frame portion of the reflector cup comprises an inner reflective surface 148 and a top surface 152. The inner reflective surface 148 may be curved to conform with the desired radius of curvature of the inner walls of the reflector cup 116. The top surface 152 may be located above the top of the light source(s) 120.

In some embodiments, portions of the lead frame 104 may be provided with fastening features which facilitate a better bond between the metal of the lead frame 104 and the plastic of the housing 112. Examples of such fastening features include, without limitation, one or more fastening holes 132 and one or more fastening grooves 136. Each of these features are provided to help the material of the housing 112 secure itself to the material of the lead frame 104 and prevent relative movement of the two components after the housing 112 has been established around the lead frame 104.

The locations for the fastening features depicted in FIG. 2 are intended to be only one example of suitable locations for the fastening features. In particular, it may be perfectly suitable to provide one or more fastening holes 132 in the lower extremities of the leads 108 or on the sides of the leads 108. Likewise, the fastening grooves 136 do not necessarily need to be provided on the top surface of the leads 108. Instead, the fastening grooves 136 can be provided on any of the surfaces of the leads 108 to facilitate a superior bond between the housing 112 and the lead frame 104.

Another possible fastening feature that is depicted in FIG. 2 is a notch or set of notches that are established between the connector 156 and the inner reflective surface 148 of the lead frame 148. These notches may help ensure that the raised portions of the lead frame 144 can be bent and shaped as desired without breaking as well as ensure that the housing 112 securely fixes the raised portions of the lead frame 144.

Figure 3:
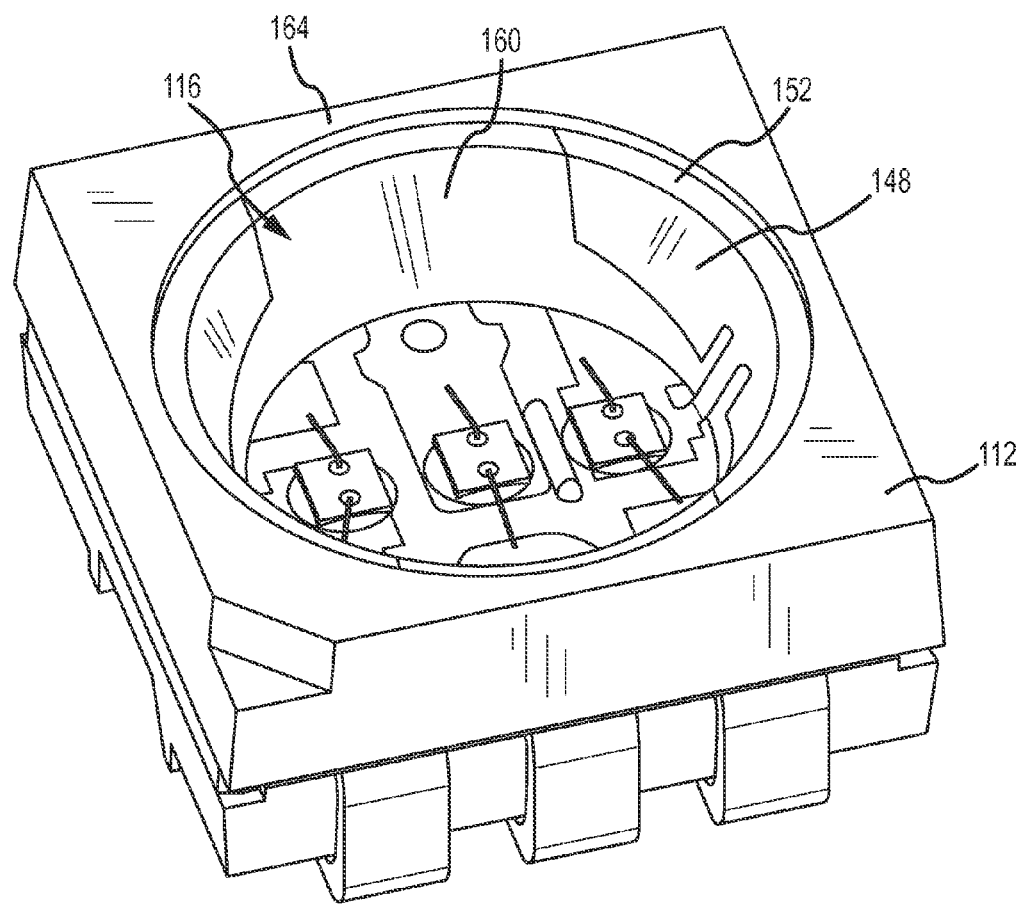
FIG. 3 is a perspective view of a PLCC package without an encapsulant in accordance with embodiments of the present disclosure.

As can be seen in FIG. 3, the housing 112 may be formed around the lead frame 104 to establish the reflector cup 116. Specifically, the housing 112 may be formed to include a reflective surface 160 which conforms with the radius of curvature established for the inner reflective surface of the lead frame 148. Stated another way, any circumference traveled along the interior wall of the reflector cup 116 may comprise smooth transitions between the lead frame 104 and the housing 112. This helps maintain the uniformity the light reflected by the reflector cup 116.

The housing 112 may also be fashioned to have a top surface that is either flush with the top surface of the raised portion of the lead frame 152 or slightly higher than the top surface of the raised portion of the lead frame 152. In some embodiments, the top surface of the raised portion of the lead frame 152 may be slightly recessed with respect to the top surface of the housing 164 and that recess may be provided to help the encapsulant 124 bond with the housing 112 and lead frame 104. The recess may also be used to help form a lens with the encapsulant 124 that rises above the top surface of the housing 164.

Figure 4:
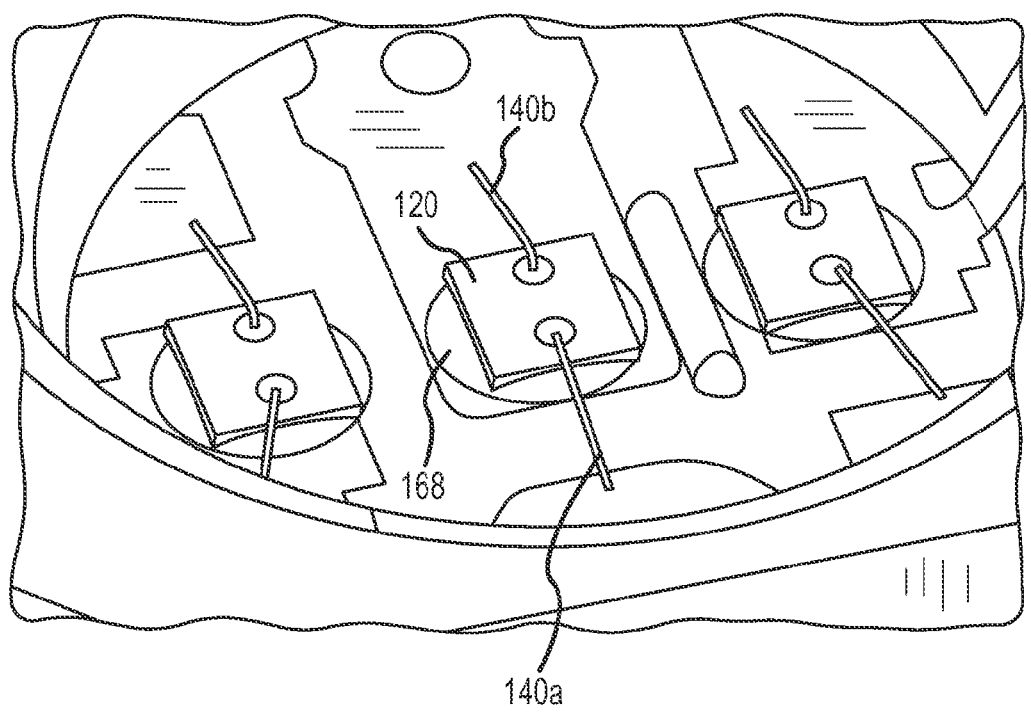
FIG. 4 is an exploded perspective view of the light sources contained within a PLCC package in accordance with embodiments of the present disclosure.

Referring now to FIG. 4, an exploded view of the reflector cup 116 is depicted in accordance with embodiments of the present disclosure. FIG. 4 helps depict how the light source(s) 120 are positioned within the bottom of the reflector cup 116 and connected to the leads 108 of the lead frame 104. FIG. 4 also shows that an adhesive 168 may be used to physically connect a light source 120 to one portion of a lead frame 128. In some embodiments, the adhesive 168 may correspond to a die attach glue or any other substance suitable for fixing the material of the light source 120 to the material of the lead 108.

In some embodiments where an anode or cathode is provided on the bottom of the light source 120, the adhesive 168 may also have properties which enable it to conduct electricity. In other words, the adhesive 168 may be configured to physically and electrically connect the light source 120 to the lead frame 108. In this configuration, the adhesive 168 may actually comprise solder or some other conductive material.

Figure 5A:
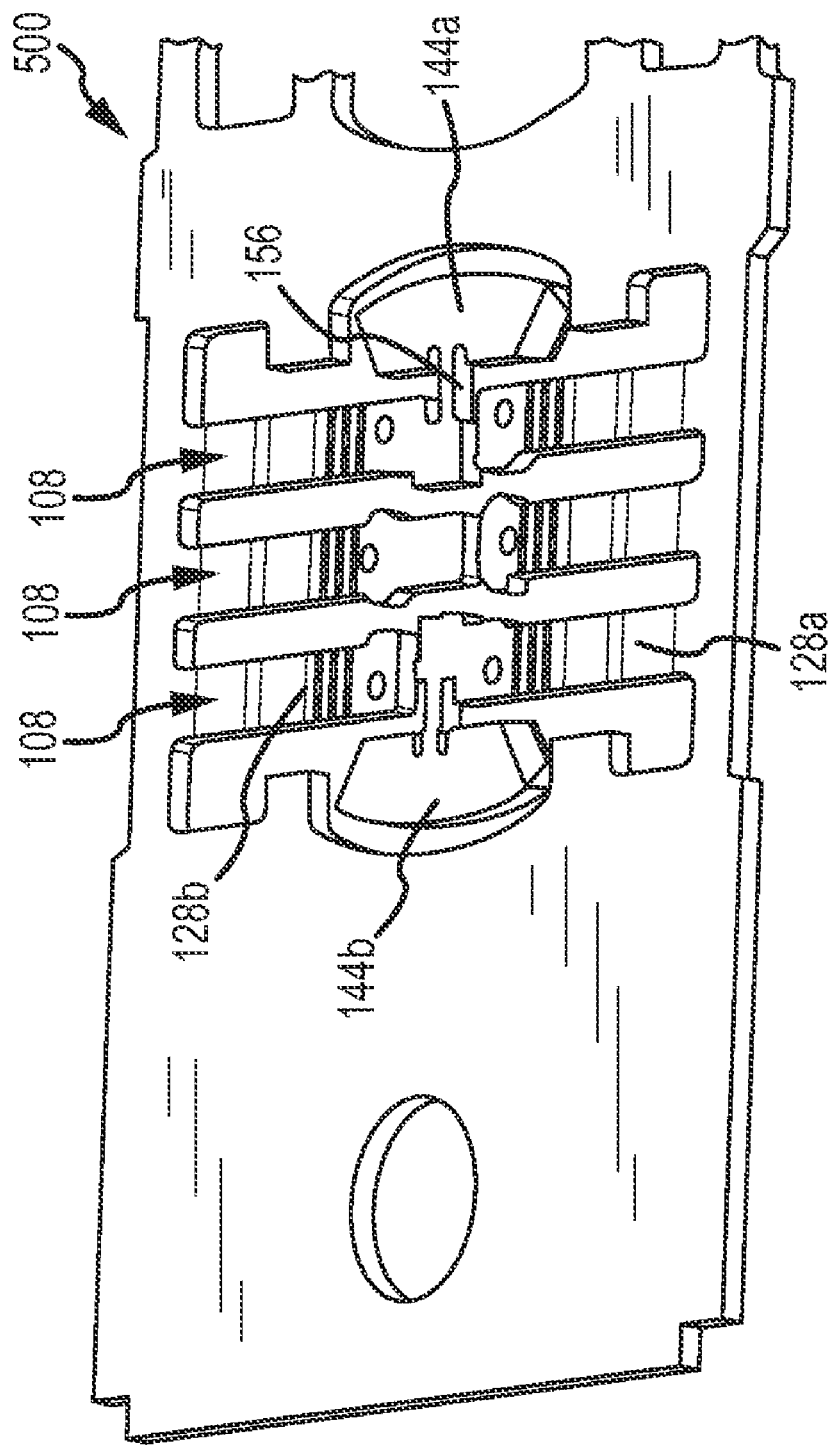
FIG. 5A depicts a first stage of a lead frame manufacturing process in accordance with embodiments of the present disclosure.

With reference now to FIGS. 5A-D, a process for manufacturing a lead frame 104 will be described in accordance with at least some embodiments of the present disclosure. FIG. 5A depicts a first processing stage where a flat plate of material 500 is provided with a number of cut-outs that establish the leads 108 and the lead frame portions of the reflector cup 144a, 144b in the common plane of the plate 500. The cut-outs may be established by machining the plate 500, etching the plate 500, carving the plate 500, or using any other known technique for removing portions of material in a common plane.

In some embodiments, the plate 500 may comprise a metal, metal alloy, aluminum, combinations thereof, or any material capable of conducting electricity. In this processing stage, both portions of each lead 128a, 128b are physically connected to carrying portions of the plate 500 and these physical connections serve as the only physical connection between the lead frame 104 and the rest of the plate 500.

Figure 5B:
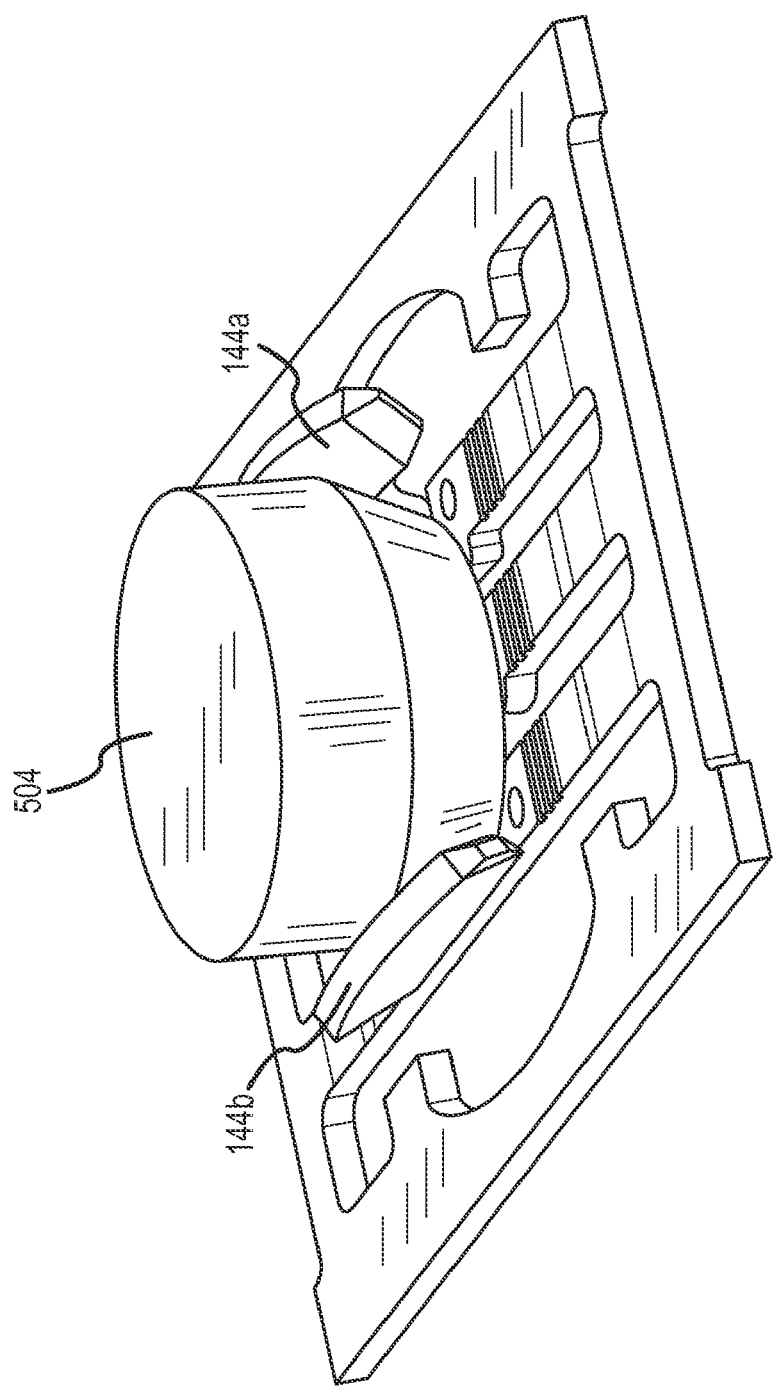
FIG. 5B depicts a second stage of a lead frame manufacturing process in accordance with embodiments of the present disclosure.

FIG. 5B depicts a second processing stage where the lead frame portions of the reflector cup 144a, 144b are simultaneously raised out of the plane of the plate 500. In some embodiments, an anvil 504 may be positioned one or proximate to one surface of the plate 500 and forces may be applied on the opposite surface of the plate 500 causing the lead frame portions of the reflector cup 144a, 144b to move toward the anvil 504 until contact is made with the anvil 504.

Figure 5C:
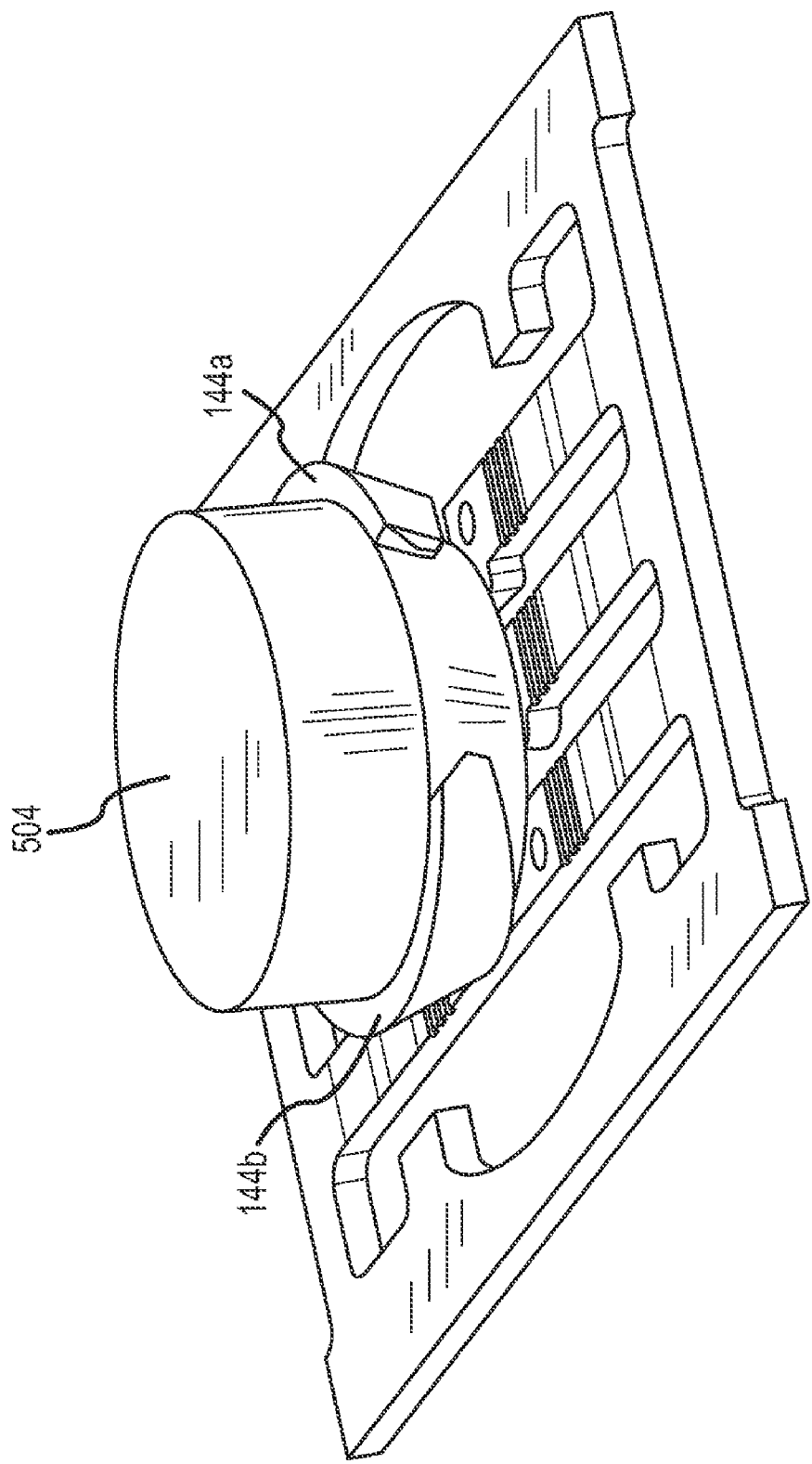
FIG. 5C depicts a third stage of a lead frame manufacturing process in accordance with embodiments of the present disclosure.

As can be seen in FIG. 5C, after contact is made between the lead frame portions of the reflector cup 144a, 144b and the anvil 504, the lead frame portions of the reflector cup 144a, 144b may be bend to conform with the outer surface of the anvil 504. This particular processing step establishes the curvature of the cylindrical (or conical) interior walls of the reflector cup 116. This processing step may also cause the extremities of the lead frame portions of the reflector cup 144a, 144b to be thinned or tapered. Specifically, the thickness of the top surface 152 may be larger than the thickness of the lower segments of the lead frame portions of the reflector cup 144a, 144b.

FIG. 5D depicts a fourth processing step that occurs after the lead frame portions of the reflector cup 144a, 144b have been curved. In this processing step the anvil 504 is moved away from its position that was proximate to the plate 500. At this point the connections between the leads 108 of the lead frame 104 and the plate 500 can be severed and the leads 108 can be bent as desired until the lead frame 104 of FIG. 2 is created. Additionally, the light source(s) 120 can be attached to the leads 108.

Figure 6:
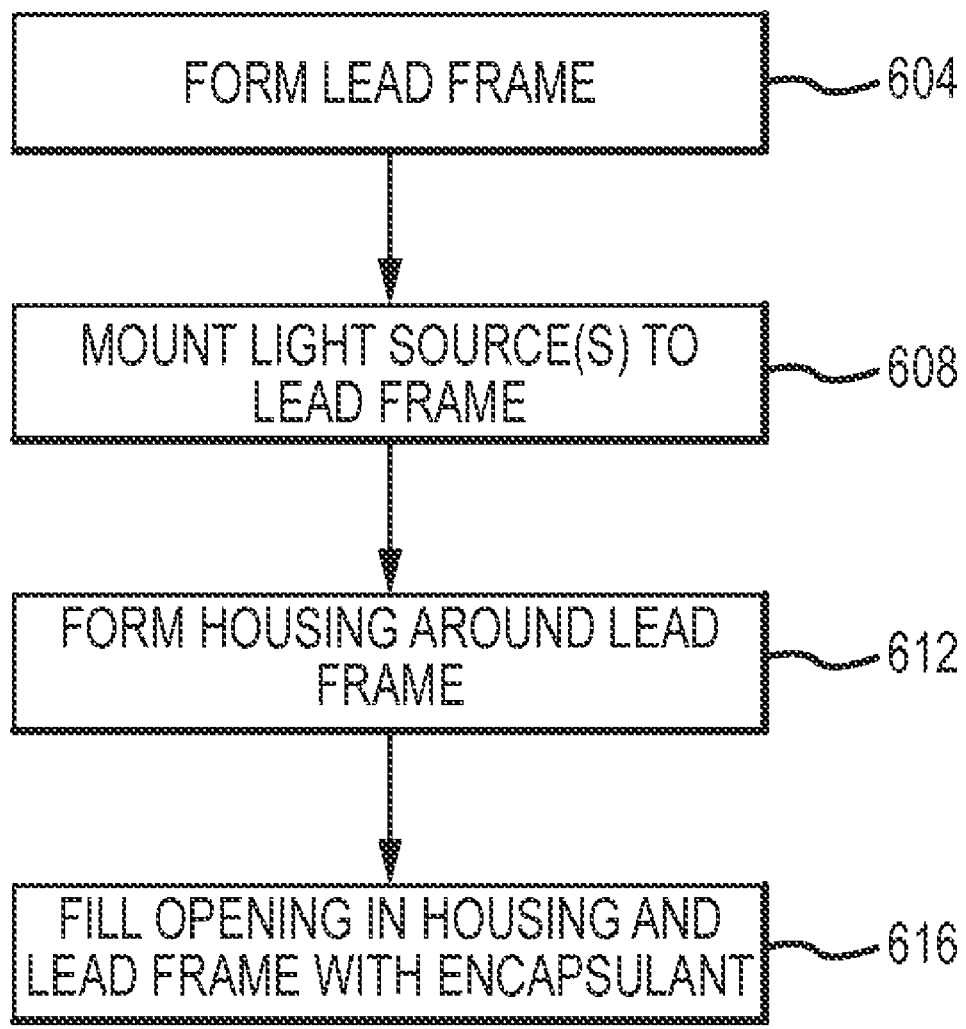
FIG. 6 is a flow diagram depicting a PLCC package manufacturing process in accordance with embodiments of the present disclosure.

With reference now to FIG. 6, a process of constructing a PLCC package 100 will be described in accordance with at least some embodiments of the present disclosure. Although the steps depicted in FIG. 6 are shown in a particular order, those of ordinary skill in the LED manufacturing arts will appreciate that certain steps may be combined and/or the order of steps may be altered without departing from the scope of the present disclosure.

Initially, a lead frame 104 having one or more leads 108 may be formed (step 604). The sub-steps of this processing step are depicted and described in more detail in connection with FIGS. 5A-D.

Once the lead frame 104 has been created, the light source(s) 120 may be mounted or connected to the leads 108 of the lead frame 104 (step 608). The manner in which the light source(s) 120 are mounted to the leads 108 may depend on the nature of the light source 120 (e.g., depending upon the relative position of the anode and cathode of the light source 120).

The housing 112 may then be formed around the lead frame 104 (step 612). In some embodiments, the housing 112 may be formed with a plastic injection molding process, in which case the plastic housing 112 may comprise a single piece of plastic. However, it may also be possible to construct the housing 112 with one, two, three, or more separate parts that are connected to one another using a bonding or fusing process or agent. In some embodiments, the reflector cup 116 may be formed in the top portion of the housing 112 as part of the injection molding process. Alternatively, the reflector cup 116 may be formed after the housing 112 has been established around the lead frame 104 by using, for example, a machining, etching, and/or stamping process. Different manufacturing alternatives may be more desirable for different types of PLCC packages 100. In some embodiments, a white plastic material may be used to form some or all of the housing 112 to improve the brightness of the PLCC package 100. In other embodiments, a black plastic material may be used to form some or all of the housing 112 to improve the contrast of the PLCC package 100.

After the housing 112 has been attached to the lead frame 104, the method continues by filling the opening of the reflector cup 116 with an encapsulant 124 (step 616). It should be appreciated that this particular step may be optional if no encapsulant 124 is desired. The encapsulant 124 may be provided into the reflector cup 116 using known injection techniques. In some embodiments, the encapsulant 124 hermetically seals the light source(s) 120 in the reflector cup 116 and protects the bonding wires 140a, 140b from shifting and/or breaking.

As can be appreciated, the PLCC package 100 may be manufactured individually or in a batch manufacturing process where each step described above is simultaneously performed on a plurality of PLCC packages 100.

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A Plastic Leaded Chip Carrier (PLCC) package, comprising:
a lead frame;
a plastic housing attached to the lead frame, the plastic housing comprising at least one cavity which defines part of a reflector cup configured to receive a light source and exposes one or more leads of the lead frame such that a light source can be positioned in a bottom surface of the reflector cup and connected to the one or more leads, wherein a wall of the reflector cup extending from the bottom surface of the reflector cup to a top surface of the plastic housing comprises a portion of the lead frame and a portion of the plastic housing so the wall has a continuous circumference crossing the portion of the lead frame and the portion of the housing.

2. The PLCC package of claim 1, wherein all circumferences of the wall comprise both a portion of the lead frame and a portion of the plastic housing.

3. The PLCC package of claim 1, wherein the wall is conical extending outwardly from the bottom surface.

4. The PLCC package of claim 1, wherein the lead frame comprises a first raised portion that is integrated into the wall of the reflector cup.

5. The PLCC package of claim 4, wherein the lead frame comprises a second raised portion that is also integrated into the wall of the reflector cup and wherein the first raised portion is electrically isolated from the second raised portion.

6. The PLCC package of claim 5, wherein the first raised portion is connected to a first lead of the lead frame and wherein the second raised portion is connected to a second lead of the lead frame.

7. The PLCC package of claim 5, wherein the first and second raised portions comprise folded tabs that are connected to the lead frame.

8. The PLCC package of claim 4, wherein the plastic housing comprises a black plastic, wherein the first raised portion comprises metal, and wherein the wall of the reflector cup includes both the black plastic and the metal.

9. The PLCC package of claim 1, wherein a top surface of the plastic housing comprises at least one of a black plastic and a white plastic.

10. The PLCC package of claim 1, further comprising an encapsulant that fills at least a portion of the reflector cup.

11. The PLCC package of claim 10, wherein the encapsulant comprises at least one of epoxy, silicone, a hybrid of silicone and epoxy, phosphor, a hybrid of phosphor and silicone, an amorphous polyamide resin or fluorocarbon, glass, and plastic.

12. A lead frame for a PLCC package, the lead frame comprising a first lead and a second lead, wherein a first raised portion is connected to the first lead, wherein a second raised portion is connected to the second lead, wherein the first and second raised portions are configured to be integrated into a wall of a reflector cup so the wall has a continuous circumference crossing the first raised portion and the second raised portion, and wherein the first and second raised portions are electrically isolated from one another.

13. The lead frame of claim 12, wherein the lead frame comprises one or more fastening features.

14. The lead frame of claim 13, wherein the one or more fastening features comprise at least one of a fastening hole and a fastening groove formed in at least one of the first and second leads.

15. The lead frame of claim 12, further comprising a third lead that does not include a raised portion connected thereto.

16. The lead frame of claim 15, wherein each of the first, second, and third leads comprise a first portion and an electrically isolated second portion.

17. The lead frame of claim 12, wherein the first and second leads comprise at least one of C-leads, SOJ leads, gull wing leads, reverse gull wing leads, and straight cut leads.

18. A Plastic Leaded Chip Carrier (PLCC) package, comprising:

a lead frame comprising a first lead and a second lead, wherein a first raised portion is connected to the first lead, wherein a second raised portion is connected to the second lead, and wherein the first and second raised portions are electrically isolated from one another;

a plastic housing; and a reflector cup established in the plastic housing, wherein the first and second raised portions of the lead frame are integrated into a wall of the reflector cup so the wall has a continuous circumference crossing the first raised portion and the second raised portion.

19. The PLCC package of claim 18, wherein the wall of the reflector cup also comprises the plastic housing.

20. The PLCC package of claim 18, wherein the first and second raised portions comprise folded tabs that are connected to the lead frame and wherein the plastic housing comprises a black plastic.

* * * * *